US009888615B1

(12) United States Patent
Frink et al.

(10) Patent No.: US 9,888,615 B1
(45) Date of Patent: Feb. 6, 2018

(54) TAPE LIBRARY RACK MODULE WITH ENVIRONMENTALLY ISOLATED INTERIOR

(71) Applicant: Amazon Technologies, Inc., Seattle, WA (US)

(72) Inventors: Darin Lee Frink, Lake Tapps, WA (US); Kevin Bailey, Seattle, WA (US); Peter George Ross, Olympia, WA (US); Bryan James Donlan, Seattle, WA (US); James Caleb Kirschner, Seattle, WA (US); Mary Crys Calansingin, Auburn, WA (US); Paul David Franklin, Seattle, WA (US); Masataka Kubo, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

(21) Appl. No.: 15/389,327

(22) Filed: Dec. 22, 2016

(51) Int. Cl.
*H05K 7/20* (2006.01)
*G11B 33/04* (2006.01)
(Continued)

(52) U.S. Cl.
CPC ....... *H05K 7/20745* (2013.01); *G11B 25/063* (2013.01); *G11B 33/04* (2013.01);
(Continued)

(58) Field of Classification Search
CPC ........... H05K 7/20745; H05K 7/20836; H05K 7/1498; G11B 33/1406; G11B 33/04; G11B 25/063
See application file for complete search history.

(56) References Cited

U.S. PATENT DOCUMENTS 5,449,229 A * 9/1995 Aschenbrenner ...... B65G 1/045
  221/21
6,366,982 B1 * 4/2002 Suzuki ................. G11B 27/002
  711/114

(Continued)

OTHER PUBLICATIONS

"HumiSonic Compact", Retrieved from URL: http://www.care/usa.com/product/humisonic on Dec. 20, 2016, pp. 1-9.

(Continued)

*Primary Examiner* — Brian Miller
(74) *Attorney, Agent, or Firm* — Robert C. Kowert; Meyertons, Hood, Kivlin, Kowert & Goetzel, P.C.

(57) ABSTRACT

A data center may include a tape library rack module along with rack computer systems. The rack computer systems may be configured to provide computing capacity within a data center environment. In some embodiments, the tape library rack module may include an enclosure encompassing an interior of the tape library rack module, a rack within the interior, and a tape library unit mounted on the rack. The tape library rack unit may include tape cartridges configured to store data within a tape environment that is different than the data center environment. The tape library rack unit may be within a portion of the interior that is enclosed such that it is environmentally isolated from the data center environment. In some examples, the tape library rack module may include a cooling unit and/or a humidifier unit, which may provide the tape environment to the environmentally isolated portion of the interior of the tape library rack module.

20 Claims, 10 Drawing Sheets

(51) Int. Cl.
*G11B 33/14* (2006.01)
*G11B 25/06* (2006.01)
*H05K 7/14* (2006.01)

(52) U.S. Cl.
CPC ....... *G11B 33/1406* (2013.01); *H05K 7/1498* (2013.01); *H05K 7/20836* (2013.01)

(56) References Cited

U.S. PATENT DOCUMENTS

| | | | | |
|---|---|---|---|---|
| 6,467,285 B2 * | 10/2002 | Felder | ............... | F25D 25/00 |
| | | | | 62/177 |
| 6,478,524 B1 * | 11/2002 | Malin | ............... | B65G 1/0407 |
| | | | | 360/92.1 |
| 6,563,771 B1 * | 5/2003 | Debiez | ............... | G11B 17/24 |
| | | | | 369/30.79 |
| 6,676,026 B1 * | 1/2004 | McKinley | ............... | G11B 15/6835 |
| | | | | 165/80.3 |
| 6,694,767 B2 * | 2/2004 | Junca | ............... | F25D 23/026 |
| | | | | 62/266 |
| 6,817,199 B2 * | 11/2004 | Patel | ............... | F25B 5/02 |
| | | | | 236/49.3 |
| 6,862,179 B2 * | 3/2005 | Beitelmal | ............... | F25D 17/06 |
| | | | | 361/679.53 |
| 7,106,538 B2 * | 9/2006 | Minemura | ............... | G11B 15/68 |
| | | | | 360/71 |
| 7,277,247 B2 * | 10/2007 | Hoshino | ............... | G11B 17/225 |
| | | | | 360/69 |
| 7,315,448 B1 * | 1/2008 | Bash | ............... | H05K 7/2079 |
| | | | | 165/80.3 |
| 7,474,497 B2 * | 1/2009 | Jesionowski | ............... | G11B 15/6835 |
| | | | | 360/92.1 |
| 7,534,167 B2 * | 5/2009 | Day | ............... | H05K 7/20745 |
| | | | | 454/187 |
| 7,635,246 B2 * | 12/2009 | Neeper | ............... | G01N 35/00732 |
| | | | | 414/280 |
| 7,682,234 B1 * | 3/2010 | Beitelmal | ............... | F24F 11/0001 |
| | | | | 361/695 |
| 7,766,733 B2 * | 8/2010 | Kasahara | ............... | G06F 1/20 |
| | | | | 361/679.48 |
| 7,961,419 B2 * | 6/2011 | Suzuki | ............... | G06F 1/184 |
| | | | | 360/69 |
| 8,090,476 B2 * | 1/2012 | Dawson | ............... | F24F 11/0009 |
| | | | | 700/276 |
| 8,151,046 B2 * | 4/2012 | Suzuki | ............... | G06F 3/0607 |
| | | | | 710/22 |
| 8,203,837 B2 * | 6/2012 | Zeighami | ............... | F24F 11/0001 |
| | | | | 165/104.19 |
| 8,206,976 B2 * | 6/2012 | Kobayashi | ............... | C12M 23/50 |
| | | | | 435/289.1 |
| 8,351,200 B2 * | 1/2013 | Arimilli | ............... | H05K 7/20745 |
| | | | | 165/104.33 |
| 8,763,414 B2 * | 7/2014 | Carlson | ............... | F25D 17/06 |
| | | | | 361/695 |
| 8,857,208 B2 * | 10/2014 | Malin | ............... | F25D 25/04 |
| | | | | 236/1 B |
| 9,255,936 B2 * | 2/2016 | Hunt | ............... | A01N 1/0236 |
| 2002/0098064 A1 * | 7/2002 | Ostwald | ............... | G11B 15/6825 |
| | | | | 414/277 |
| 2006/0177922 A1 * | 8/2006 | Shamah | ............... | B01L 9/523 |
| | | | | 435/286.2 |
| 2012/0014061 A1 * | 1/2012 | Slessman | ............... | H05K 7/20745 |
| | | | | 361/691 |
| 2012/0243173 A1 * | 9/2012 | Archibald | ............... | G06F 1/206 |
| | | | | 361/679.46 |
| 2014/0053588 A1 * | 2/2014 | Karrat | ............... | H05K 7/20836 |
| | | | | 62/203 |
| 2014/0316605 A1 * | 10/2014 | Conan | ............... | G05D 23/30 |
| | | | | 700/300 |
| 2015/0208553 A1 * | 7/2015 | Bauchot | ............... | H05K 7/20745 |
| | | | | 361/679.47 |
| 2015/0351290 A1 * | 12/2015 | Shedd | ............... | H05K 7/20809 |
| | | | | 361/679.47 |
| 2016/0192542 A1 * | 6/2016 | LeFebvre | ............... | H05K 7/20836 |
| | | | | 361/679.47 |

OTHER PUBLICATIONS

"Scalari3: Easy, Efficient, Scalable Tape Library with LTO Technology", Retrieved from URL: http://www.quantum.com/products/tapelibraries/scalari3/index.aspx on Dec. 20, 2016, pp. 1-5.

"Network/server enclosures TS IT with glazed door, with 482.6 mm (19") mounting angles Model No. DK 5508, 120", Retrieved from URL: http://www.rittal.com/us-en/product/show/variantdetal.action?c=/Enclosures/IT%20network%20and%server%20enclosures/TS%20IT&categoryPath=/PG00 . . . . on Dec. 20, 2016, pp. 1-6.

"TopTherm Blue e roof-mounted cooling units Total cooling output 0.50-4.00 kW", Retrieved from URL: http://www.rittal.com/us-en/product/list/variations.action?c=/Climate%20control/Cooling%20units/Roof-Mounted%20Cooling%20Units&categoryPath=/PG0001/ . . . . on Dec. 20, 2016, pp. 1-3.

* cited by examiner

TAPE LIBRARY RACK MODULE WITH ENVIRONMENTALLY ISOLATED INTERIOR

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

In addition, as the technological capacity for organizations to create, track, and retain information continues to grow, a variety of different technologies for managing and storing the rising tide of information have been developed. Secure and reliable long-term data storage is one such technology that satisfies the need to archive collected information that may be used infrequently. For instance, information archives may be stored on physical mediums, such as magnetic tape data storage.

Figure 1:
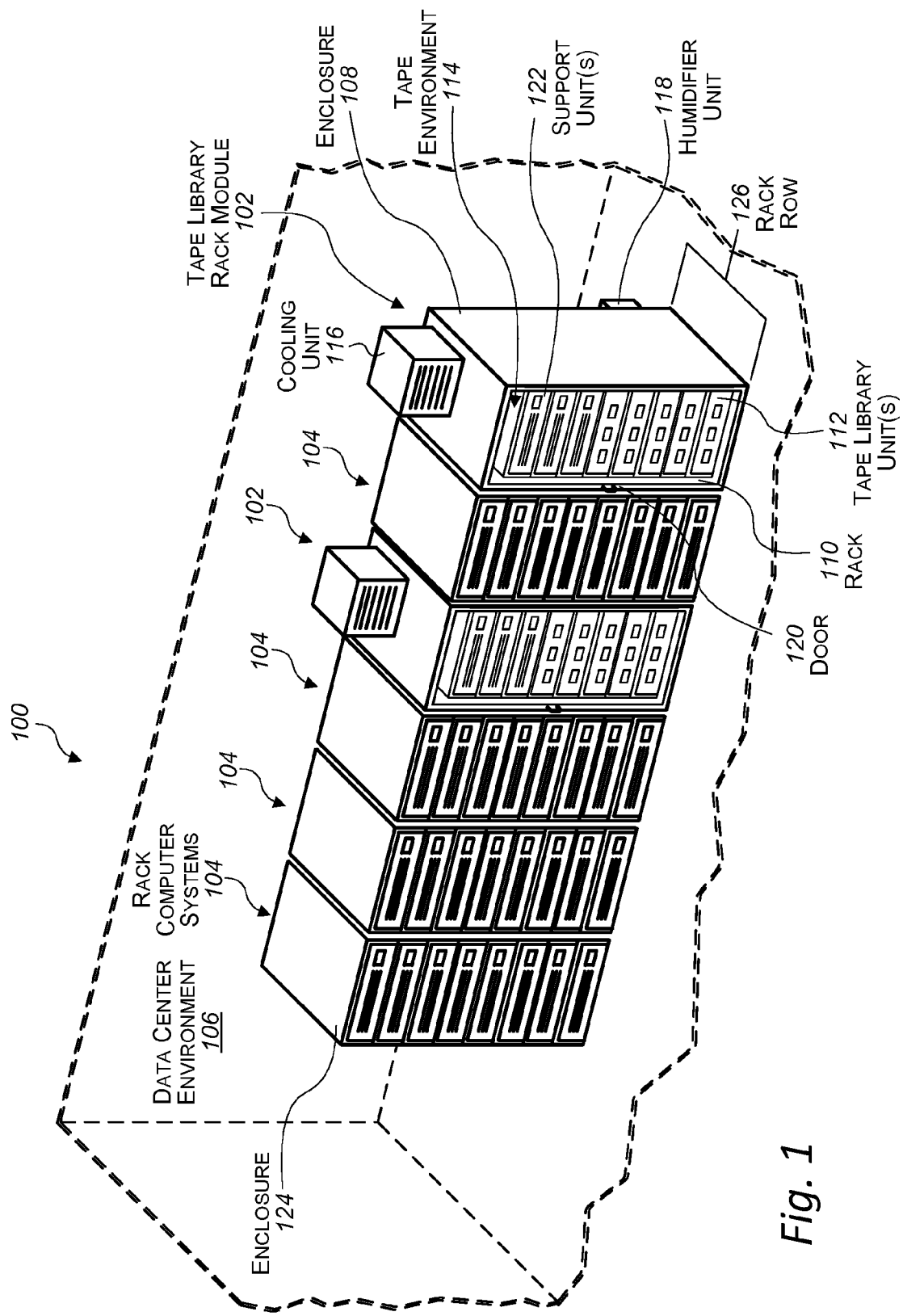
FIG. 1 illustrates a data center 100 that includes example tape library rack modules 102 along with rack computer systems 104, in accordance with some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments disclosed herein relate to a tape library rack module with an environmentally isolated interior portion. The environmentally isolated interior portion of the tape library rack module may allow for the tape library rack module to be placed within a data center environment (e.g., an environment, or climate, inside a data center room) while maintaining a tape environment (e.g., an environment, or climate, that is appropriate for storing data on tape cartridges) within the environmentally isolated interior portion of the tape library rack module.

Some conventional archival solutions may involve placing archival hardware (e.g., tape hardware) in special purpose rooms that are separate from data centers. Such special purpose rooms may maintain particular environmental conditions that are stricter than those of the data center. Accordingly, those conventional archival solutions may not be energy efficient or cost effective. In contrast, embodiments of the tape library rack module described herein allow for the tape environment to be maintained within a smaller volume (the environmentally isolated interior portion of the tape library rack module) and thus may provide a solution that is more energy efficient and/or cost effective than some conventional archival solutions.

In some embodiments, a data center may include a tape library rack module along with rack computer systems. For instance, the rack computer systems may include servers mounted on server racks as are typically found in data centers. The rack computer systems may be configured to provide computing capacity within a data center environment. In some examples, the data center environment may include a data center temperature range and a data center relative humidity range. For instance, the data center temperature range may be from about 5 degrees Celsius to about 40 degrees Celsius, and the data center relative humidity range may be from about 8 percent to about 85 percent.

In various examples, the tape library rack module may include an enclosure encompassing an interior of the tape library rack module, a rack within the interior, and a tape library unit mounted on the rack. The tape library unit may be within a portion of the interior that is enclosed such that the portion of the interior is environmentally isolated from the data center environment. The tape library unit may include tape cartridges configured to store data within a tape environment that is different than the data center environment. In some examples, the tape environment may include a tape temperature range and/or a tape relative humidity range. For instance, the tape temperature range may be from about 16 degrees Celsius to about 25 degrees Celsius, and the tape relative humidity range may be from about 20 percent to about 50 percent.

In some examples, the tape library rack module may include a cooling unit configured to cool the portion of the interior that includes the tape library unit. Additionally, or alternatively, the tape library rack module may include a humidifier unit configured to humidify the portion of the interior that includes the tape library unit. The tape library rack module may be configured to maintain the tape environment within the portion of the interior based at least in part on one or more of the cooling unit or the humidifier unit. The enclosure of the tape library rack module may include a top wall, a bottom wall opposite the top wall, a front wall, a rear wall opposite the front wall, a first side wall, and a second side wall opposite the first side wall. In some examples, the cooling unit may be mounted on the top wall of the enclosure. Furthermore, in some examples, the humidifier unit may be mounted on the rear wall of the enclosure. In some embodiments, the front wall may include a door configured to provide access to the interior of the tape library rack module.

In some embodiments, the tape library rack module may include a server and/or a switch (e.g., a network switch, a console switch, etc.) within the interior of the tape library rack module. For instance, the tape library unit may be mounted on the rack within a first portion of the interior, and the server and/or switch may be mounted on the rack within a second portion of the interior. In some cases, the first portion of the interior and the second portion of the interior may share a same environment (e.g., the tape environment) that is appropriate for storing data on tape cartridges. For instance, the enclosure may define the bounds within which the tape environment is maintained. However, in other cases, the tape library rack module may include a partition structure that partitions the first portion of the interior from the second portion of the interior such that the first portion of the interior is environmentally isolated from the second portion of the interior.

In some cases, the tape library rack module may include multiple tape library units mounted on the rack within the environmentally isolated portion of the interior. For example, the tape library units may include an expansion unit and/or a control unit. The expansion unit may include tape cartridges and/or storage locations for tape cartridges. The control unit may include a robot configured to traverse the tape library units to transport tape cartridges from their respective storage locations to a tape drive, and vice-versa. The tape drive may be located in a tape library unit, e.g., in the control unit. The tape drive may be configured to read data from the tape cartridges and/or write data to the tape cartridges.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, a "duct" includes any device, apparatus, element, or portion thereof, that can direct, segregate, or channel a fluid, such as air. Examples of ducts include cloth or fabric ducts, sheet metal ducts, molded ducts, tubes, or pipes. The cross sectional shape of a passageway of a duct may be square, rectangular, round or irregular, and may be uniform or change over the length of the duct. A duct may be a separately produced component or integral with one or more other components, such as a frame.

As used herein, "installed" means in place on, or coupled to, a supporting structure or element. In some embodiments, a computer system is installed such that it can be moved on the structure to which it is mounted. For example, a server may be installed on a rail such that the server can slide along the rail.

As used herein, a "module" means a component or a combination of components physically coupled to one another. A module may include functional elements and systems, such as computer systems, racks, blowers, ducts, power distribution units, fire suppression systems, and control systems, as well as structural elements, such a frame, housing, or container. In some embodiments, a module is pre-fabricated at a location off-site from a data center.

As used herein, a "rack" means a rack, container, frame, or other element or combination of elements that can contain or physically support one or more computing devices.

As used herein, "room" means a room or a space of a building. As used herein, "computer room" means a room of a building in which computer systems, such as rack-mounted servers, are operated.

As used herein, a "space" means a space, area or volume.

FIG. 1 illustrates a data center 100 that includes example tape library rack modules 102 along with rack computer systems 104, in accordance with some embodiments. The rack computer systems 104 may be configured to provide computing capacity within a data center environment 106 (e.g., an environment inside a data center room). In some examples, the data center environment 106 may include one or multiple environmental parameters at which the data center 100 is maintained. For instance, the data center environment 106 may include a data center temperature range and/or a data center relative humidity range. In some examples, the data center temperature range may be from about 5 degrees Celsius to about 40 degrees Celsius, and the data center relative humidity range may be from about 8 percent to about 85 percent.

In various embodiments, a tape library rack module 102 may include an enclosure 108 encompassing an interior of the tape library rack module 102, a rack 110 within the interior, and tape library units 112 mounted on the rack 110. The tape library units 112 may be within a portion of the interior that is enclosed and environmentally isolated from the data center environment 106. The tape library units 112 may include tape cartridges (e.g., tape cartridges 612 described below with reference to FIG. 6) configured to store data within a tape environment 114 that is different than the data center environment 106. In some examples, the tape environment 114 may include one or multiple environmental parameters at which an interior portion of the tape library rack module 102 is maintained. For instance, the tape environment 114 may include a tape temperature range and/or a tape relative humidity range. In some examples, the tape temperature range may be from about 16 degrees Celsius to about 25 degrees Celsius, and the tape relative humidity range may be from about 20 percent to about 50 percent.

In some examples, the tape library rack module 102 may include a cooling unit 116 configured to cool the interior portion of the tape library rack module 102 that includes the tape library unit 112. Additionally, or alternatively, the tape library rack module 102 may include a humidifier unit 118 configured to humidify the interior portion of the tape library rack module 102 that includes the tape library unit 112. The tape library rack module 102 may be configured to maintain the tape environment within the interior portion based at least in part on the cooling unit 116 and/or the humidifier unit 118.

In some embodiments, the enclosure 108 of the tape library rack module 102 may include a top wall, a bottom wall opposite the top wall, a front wall, a rear wall opposite the front wall, a first side wall, and a second side wall opposite the first side wall. In some examples, the cooling unit 116 may be mounted on the top wall of the enclosure 108. Furthermore, in some examples, the humidifier unit 118 may be mounted on the rear wall of the enclosure 108. In some cases, the front wall may include a door 120 configured to provide access to the interior of the tape library rack module 102.

In some embodiments, the tape library rack module 102 may include support units 122 within the interior of the tape library rack module 102. The support units 122 may be configured to provide support to the tape library units 112. For instance, as described in further detail below with reference to FIG. 6, the support units 122 may include one or multiple servers and/or one or multiple switches.

In some embodiments, the rack 110 of the tape library rack module 102 may be a standard rack, e.g., as specified by the Electronic Industries Association (EIA), that is 42 U high. In a particular example, each of the support units may be 1 U in height, and the tape library units may include units that range from 1 U in height to 6 U in height. However, the sizes of the support units and/or the tape library units may vary in other embodiments.

In some examples, each of the rack computer systems 104 is at least partially enclosed by a respective enclosure 124. The enclosure 108 of the tape library rack module 102 may have a form factor that is the same as, or similar to, the enclosure 124 of the rack computer systems 104. In some examples, the enclosure 108 of the tape library rack module 102 may be shaped such that it is capable of being placed in a same rack row 126 as the rack computer systems 104.

Figure 2:
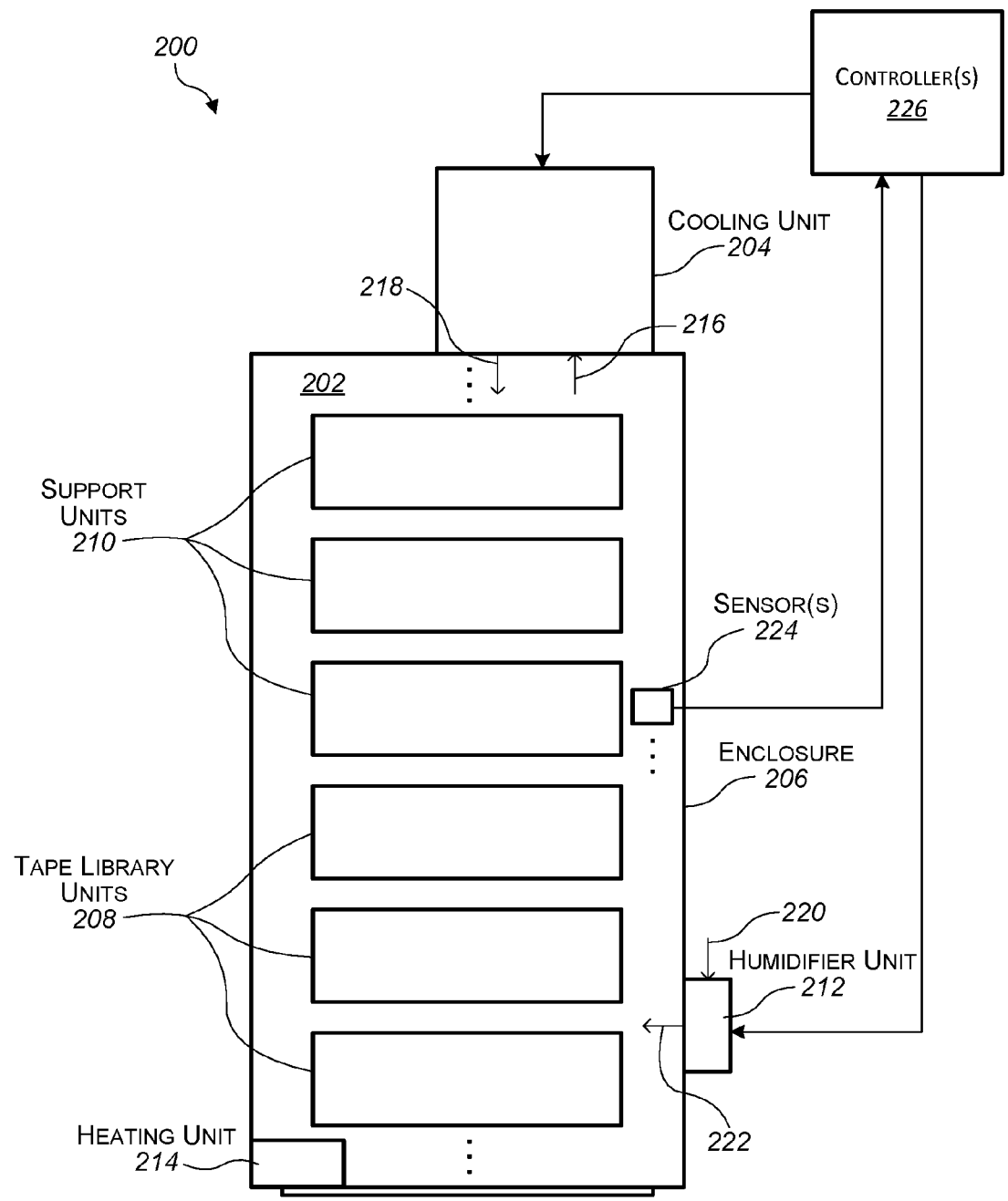
FIG. 2 illustrates a cross-sectional side view of an example tape library rack module that includes an environmentally isolated interior, in accordance with some embodiments. The example tape library rack module of FIG. 2 includes a cooling unit mounted on a top wall of an enclosure, in accordance with some embodiments.

FIG. 2 illustrates a cross-sectional side view of an example tape library rack module 200 that includes an environmentally isolated interior 202, in accordance with some embodiments. The tape library rack module 200 may include a cooling unit 204 mounted on a top wall of an enclosure 206, in accordance with some embodiments. In various embodiments, the tape library rack module 200 may be used in a data center that provides a data center environment to rack computer systems, e.g., the data center 100 described above with reference to FIG. 1. Furthermore, in some embodiments, the tape library rack module 200 may include features of one or more embodiments of the tape library rack modules described above and below with reference to FIGS. 1 and 3-10.

The tape library rack module 200 may include one or multiple tape library units 208 and one or multiple support units 210. In some examples, the tape library units 208 may include one or multiple control units and/or one or multiple expansion units, arranged in an order compatible with the design of the tape library units. Furthermore, the support units may include one or multiple servers, one or multiple console switches, and/or one or multiple network switches. The tape library units 208 may include tape cartridges and other tape library components. The tape cartridges may be configured to store data within a particular tape environment. The support units 210 may be configured to provide support to the tape library units 208. For instance, the server may communicate with the control unit to provide control information used to control certain functions of the tape library units 208. The tape library units 208 and the support units 210 are described in further detail below with reference to FIG. 6.

In some embodiments, the tape library rack module 200 may include a cooling unit 204 configured to cool the environmentally isolated interior 202 and/or a humidifier unit 212 configured to humidify the environmentally isolated interior 202. In some cases, the tape library rack module 200 may include a heating unit 214 (e.g., an internal heating unit coupled to the enclosure) configured to heat the environmentally isolated interior 202. The cooling unit 204, the humidifier unit 212, and/or the heating unit 214 may be used to maintain the tape environment within the environmentally isolated interior 202 of the tape library rack module 200. As illustrated in FIG. 2, in some embodiments the tape library units 208 and the support units 210 may share a same tape environment. For instance, the enclosure 206 of the tape library rack module 200 may be the enclosure that encloses and environmentally isolates the tape environment within the interior 202. In other cases, however, the tape library units 208 may be partitioned from the support units 210 such that the tape environment is provided to the tape library units but not to the support units, e.g., as described below with reference to FIGS. 4 and 5.

In some embodiments, the cooling unit 204 may include a heat exchanger. Air within the tape library rack module 200 may be circulated over the heat exchanger to cool the air, and the air may be cycled within the tape library rack module 200. That is, in some embodiments, the air within the tape library rack module 200 may not be exchanged with air that is outside of the tape library rack module 200. Outside air (e.g., data center air) may be passed over the heat exchanger to reject heat. One or more intake ducts 216 or ports may be configured to intake air from the interior 202 into the cooling unit 204. One or more exhaust ducts 218 or ports may be configured to exhaust air from the cooling unit 204 back into the interior 202 of the tape library rack module 200.

In some examples, the humidifier unit 212 may be configured to increase the moisture within the air inside the environmentally isolated interior 202 of the tape library rack module 200. The humidifier unit 212 may receive water from a water source/supply (e.g., as described below with reference to FIGS. 4 and 5) via a water intake 220 and exhaust moisture (e.g., in the form of mist) into the environmentally isolated interior 202 of the tape library rack module 200 via a moisture exhaust 222. In some examples, the humidifier unit 212 may be an ultrasonic humidifier. However, any other type of humidifier suitable for contributing to the maintenance of the interior 202 within the tape environment may be used as the humidifier unit 212.

In some embodiments, the tape library rack module 200 may include one or multiple sensors 224 configured to detect one or multiple environmental parameters within the environmentally isolated interior 202 of the tape library rack module 200. The environmental parameters may be associated with the tape environment within which the tape library units are maintained. For instance, the environmental parameters may include temperature and/or relative humidity. As such, the sensors 224 may include a temperature sensor and/or a humidity sensor.

The environmental parameters detected by the sensors 224 may be communicated to one or multiple controllers 226. For instance, a controller 226 may reside within the tape library rack module 200 (e.g., within the server), or, as illustrated in FIG. 2, the controller 226 may reside outside of the tape library rack module 200. In some examples, the sensors 224 may be coupled to one or more components (e.g., the server) within the tape library rack module 200 that are configured to communicate with the controller 226. The controller 226 may receive sensor information from the sensors 224 and process (e.g., via one or more processors) the sensor information to determine how to operate the cooling unit 204, the humidifier unit 212, and/or the heating unit 214 to maintain the tape environment within the environmentally isolated interior 202 of the tape library rack module 200. Additionally, or alternatively, the controller 226 may determine how to operate the cooling unit 204, the humidifier unit 212, and/or the heating unit 214, to maintain the tape environment within the environmentally isolated interior 202 of the tape library rack module 200, based at least in part on weather forecast data, historical information associated with environmental parameters detected within the data center, and/or historical information associated with environmental parameters detected within the tape library rack module 200.

As a non-limiting example, the tape library rack module 200 may be used in a data center that runs cool at night and warm during the day (e.g., if the data center uses outside air to help heat and cool it), and thus the interior 202 of the tape library rack module 200 may correspondingly experience fluctuations in temperature. Because cold air can hold less moisture than warm air, the controller 226 may determine to increase the output of the humidifier unit 212 and/or the heating unit 214 at night, and to increase the output of the cooling unit 204 during the day. For instance, such determinations may be made by the controller 226 based on sensor information received from the sensors 224, based on historical information associated with environmental parameters detected within the data center and/or within the tape library rack module 200, and/or based on weather forecast data.

In some examples, the controller 226 may also be used to control whether or not a door (e.g., the door 120 described above with reference to FIG. 1) of the tape library rack module 200 is locked. The controller 226 may determine to keep the door locked when the environmental parameters detected within the interior 202 indicate that opening the door would be unsafe. On the other hand, the controller 226 may determine to allow access to the interior 202 via the door when the environmental parameters detected within the interior 202 indicate that opening the door would be safe. For instance, the controller 226 may check the environmental parameters detected within the interior 202 against safety criteria in determining whether or not opening the door would be safe.

Figure 3:
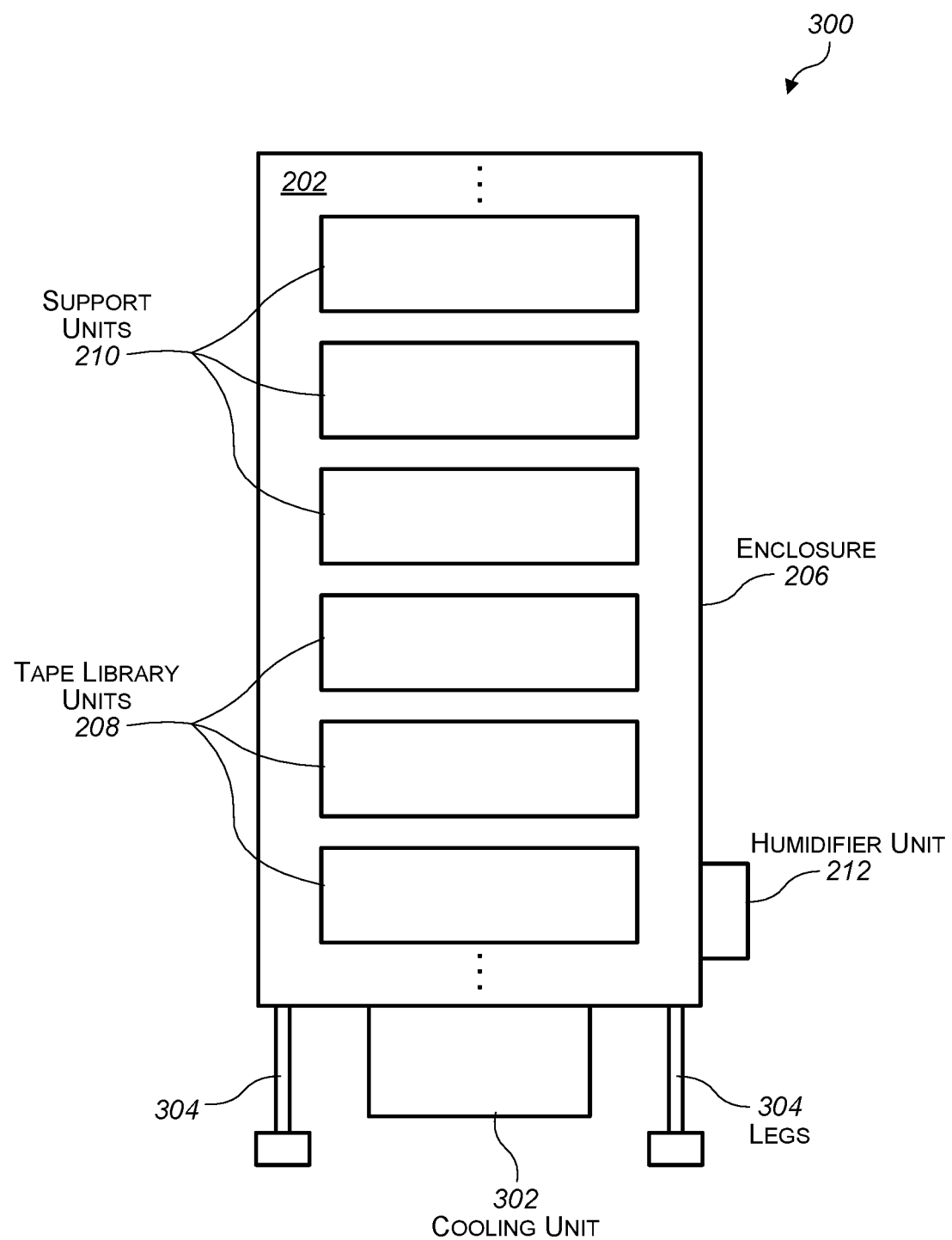
FIG. 3 illustrates a cross-sectional side view of another example tape library rack module that includes an environmentally isolated interior, in accordance with some embodiments. The example tape library rack module of FIG. 3 includes a cooling unit mounted on a bottom wall of an enclosure, in accordance with some embodiments.

FIG. 3 illustrates a cross-sectional side view of another example tape library rack module 300 that includes an environmentally isolated interior 202, in accordance with some embodiments. In various embodiments, the tape library rack module 300 may be used in a data center that provides a data center environment to rack computer systems, e.g., the data center 100 described above with reference to FIG. 1. Furthermore, in some embodiments, the tape library rack module 300 may include features of one or more embodiments of the tape library rack modules described above and below with reference to FIGS. 1, 2, and 4-10. The tape library rack module 300 may include a cooling unit 302 mounted on a bottom wall of an enclosure 206, in accordance with some embodiments. Furthermore, the tape library rack module 300 may include legs 304 extending downwardly from the bottom wall of the enclosure 206. The legs 304 may be configured to support the tape library rack module 300 in an elevated position, relative to the floor, to provide a clearance between the floor and the cooling unit 302 while the cooling unit is mounted on the bottom wall of the enclosure 206.

Figure 4:
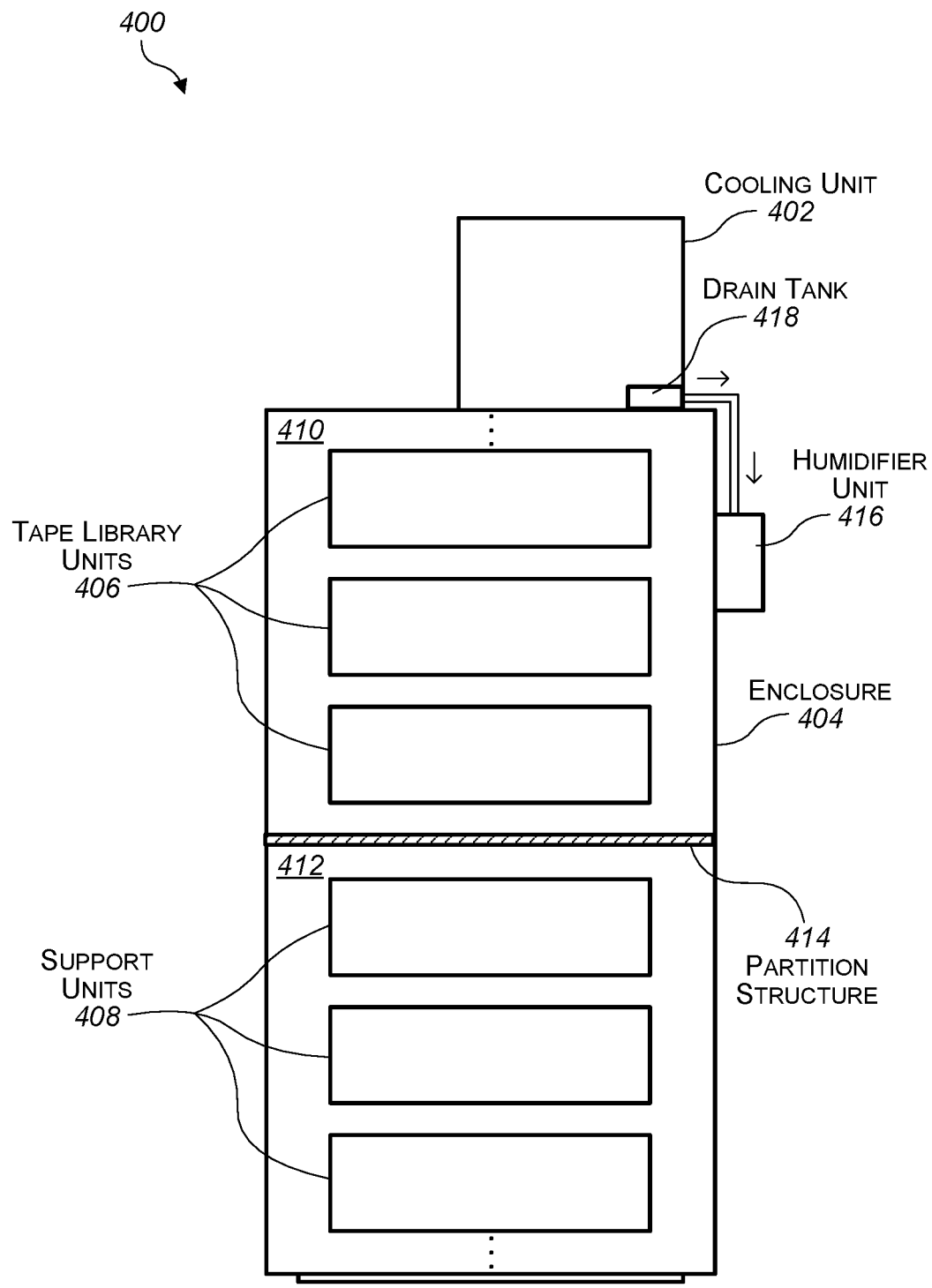
FIG. 4 illustrates a cross-sectional side view of an example tape library rack module that includes a partitioned environmentally isolated interior, in accordance with some embodiments. The example tape library rack module of FIG. 4 includes a cooling unit mounted on a top wall of an enclosure, in accordance with some embodiments.

FIG. 4 illustrates a cross-sectional side view of an example tape library rack module 400 that includes a partitioned environmentally isolated interior, in accordance with some embodiments. The tape library rack module 400 may include a cooling unit 402 mounted on a top wall of an enclosure 404, in accordance with some embodiments. The enclosure 404 may encompass an interior of the tape library rack module 400. In various embodiments, the tape library rack module 400 may be used in a data center that provides a data center environment to rack computer systems, e.g., the data center 100 described above with reference to FIG. 1. Furthermore, in some embodiments, the tape library rack module 400 may include features of one or more embodiments of the tape library rack modules described above and below with reference to FIGS. 1-3 and 5-10.

The tape library rack module 400 may include tape library units 406 and support units 408, e.g., the tape library units and support units described above and below with reference to FIGS. 2 and 6. In some embodiments, the tape library units 406 may be located within a first portion 410 of the interior, and the support units 408 may be located within a second portion 412 of the interior. The tape library rack module 400 may include a partition structure 414 that partitions the first portion 410 of the interior from the second portion 412 of the interior such that the first portion 410 of the interior is environmentally isolated from the second portion 412 of the interior and environmentally isolated from an environment exterior to the tape library rack module 400 (e.g., a data center environment). The first portion 410 of the interior may be a portion within which a tape environment is maintained for the tape library units 406.

In some embodiments, the environmentally isolated first portion 410 of the interior may be fully encompassed by a combination of the enclosure 404 and the partition structure 414. For instance, the enclosure 404 may define a top boundary and side boundaries of the interior portion 410, and the partition structure 414 may define a bottom boundary of the interior portion 410. In some examples, the partition structure 414 may extend parallel to the tape library units 406 and/or the support units 408. However, the partition structure 414 may take any form that provides suitable partitioning between the first portion 410 of the interior and the second portion 412 of the interior such that the first portion 410 is environmentally isolated from the second portion 412.

In some embodiments, the tape library rack module 400 may include a cooling unit 402 (e.g., the cooling unit 204 described above with reference to FIG. 2) configured cool the first portion 410 of the interior and/or a humidifier unit 416 (e.g., the humidifier unit 220 described above with reference to FIG. 2) configured to humidify the first portion 410 of the interior. The cooling unit 402 and/or the humidifier unit 416 may be used to maintain the tape environment within the environmentally isolated first portion 410 of the interior of the tape library rack module 400. As illustrated in FIG. 4, in some embodiments, the cooling unit 402 may be mounted on a top wall of the enclosure 404, and the humidifier unit 416 may be mounted on a rear wall of the enclosure 404. However, in some embodiments, the cooling unit 402 and/or the humidifier unit 416 may be mounted in any other location suitable for providing the tape environment to the tape library units 406 within an environmentally isolated interior portion of the tape library rack module 400.

In some examples, heat produced by the support units 408 within the second portion 412 of the interior may be used to provide heat to the first portion 410 of the interior to maintain the tape environment within the first portion 410. In some embodiments, the partition structure 414 may be configured to provide one or more passages (not shown) to allow heat to flow from the second portion 412 to the first portion 410. For instance, the partition structure 414 may include a portion that selectively opens to provide a passage when heat is desired for the first portion 410. In some cases, one or more air handling devices (not shown) may be used to force a transfer of heat from the second portion 412 to the first portion 410 via the passage(s).

In various examples, the tape library rack module 400 may include a drain tank 418. For instance, the cooling unit 402 may cause air to condense, and the drain tank 418 may be configured to capture and/or drain the condensate. In some examples, the condensate captured by the drain tank 418 may be used as a water supply for the humidifier unit 416, as indicated by the arrows in FIG. 4.

Figure 5:
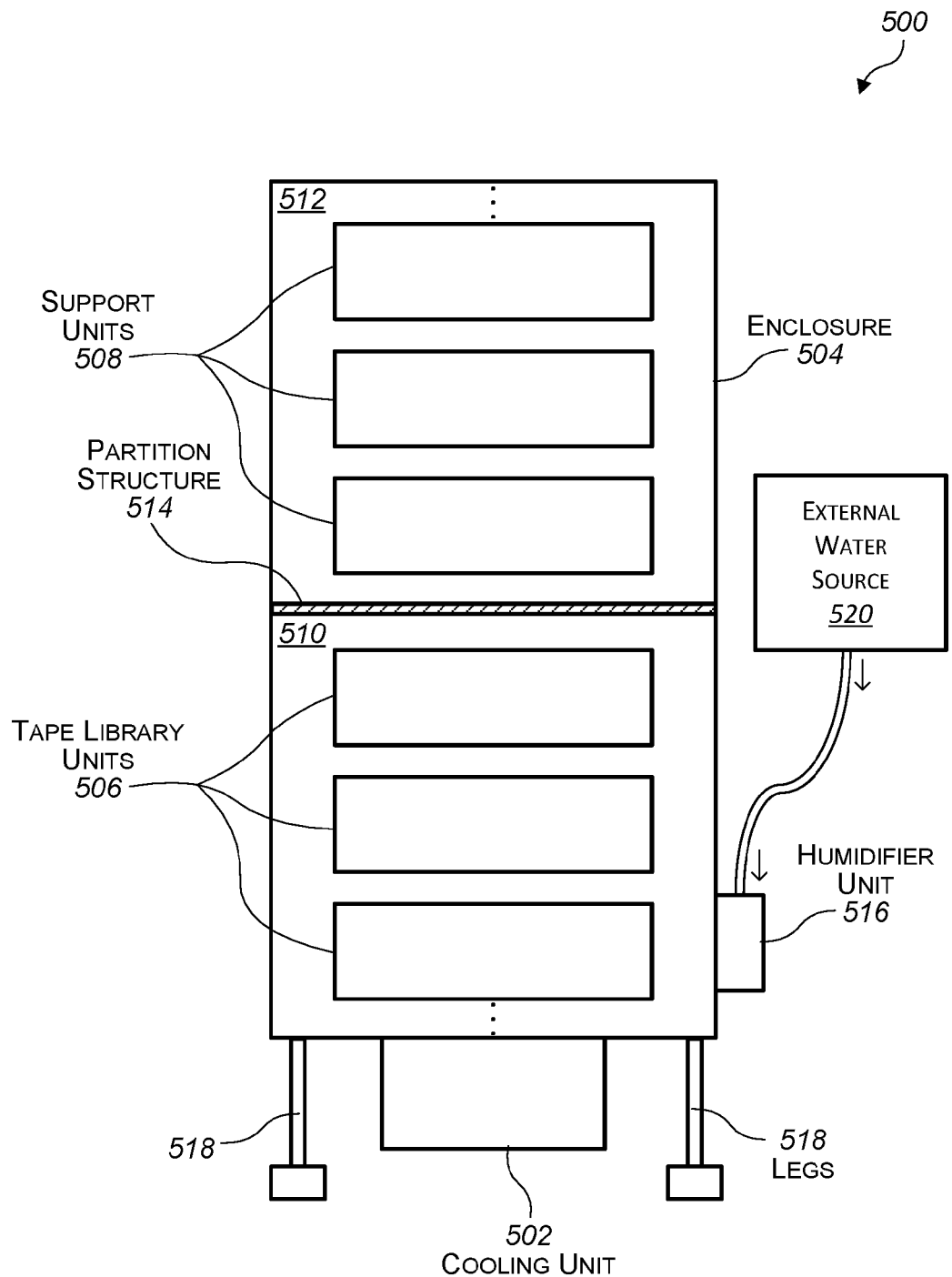
FIG. 5 illustrates a cross-sectional side view of another example tape library rack module that includes a partitioned environmentally isolated interior, in accordance with some embodiments. The example tape library rack module of FIG. 5 includes a cooling unit mounted on a bottom wall of an enclosure, in accordance with some embodiments.

FIG. 5 illustrates a cross-sectional side view of another example tape library rack module 500 that includes a partitioned environmentally isolated interior, in accordance with some embodiments. The tape library rack module 500 may include a cooling unit 502 mounted on a bottom wall of an enclosure 504, in accordance with some embodiments. The enclosure 504 may encompass an interior of the tape library rack module 500. In various embodiments, the tape library rack module 500 may be used in a data center that provides a data center environment to rack computer systems, e.g., the data center 100 described above with reference to FIG. 1. Furthermore, in some embodiments, the tape library rack module 500 may include features of one or more embodiments of the tape library rack modules described above and below with reference to FIGS. 1-4 and 6-10.

The tape library rack module 500 may include tape library units 506 and support units 508, e.g., the tape library units and support units described above and below with reference to FIGS. 2 and 6. In some embodiments, the tape library units 506 may be located within a first portion 510 of the interior, and the support units 508 may be located within a second portion 512 of the interior. The tape library rack module 500 may include a partition structure 514 (e.g., the partition structure 414 described above with reference to FIG. 4) that partitions the first portion 510 of the interior from the second portion 512 of the interior such that the first portion 510 of the interior is environmentally isolated from the second portion 512 of the interior and environmentally isolated from an environment exterior to the tape library rack module 400 (e.g., a data center environment). The first portion 510 of the interior may be a portion within which a tape environment is maintained for the tape library units 506.

In some embodiments, the tape library rack module 500 may include a cooling unit 502 (e.g., the cooling unit 204 described above with reference to FIG. 2) configured cool the first portion 510 of the interior and/or a humidifier unit 516 (e.g., the humidifier unit 220 described above with reference to FIG. 2) configured to humidify the first portion 510 of the interior. The cooling unit 502 and/or the humidifier unit 516 may be used to maintain the tape environment within the environmentally isolated first portion 510 of the interior of the tape library rack module 500. As illustrated in FIG. 5, in some embodiments, the cooling unit 502 may be mounted on a bottom wall of the enclosure 504, and the humidifier unit 516 may be mounted on a rear wall of the enclosure 504.

Furthermore, the tape library rack module 500 may include legs 518 extending downwardly from the bottom wall of the enclosure 504. The legs 518 may be configured to support the tape library rack module 500 in an elevated position, relative to the floor, to provide a clearance between the floor and the cooling unit 502 while the cooling unit is mounted on the bottom wall of the enclosure 504.

In some cases, an external water source 520 may be used as a water supply for the humidifier unit 516. For example, the external water source 520 may be water that is captured from another module or system within a data center room. As another example, the external water source 520 may be a container (e.g., a bottle) that holds a fixed amount of water to be supplied to the humidifier unit 516, where the water may be replaced periodically. The container may be coupled to the humidifier unit 516.

Figure 6:
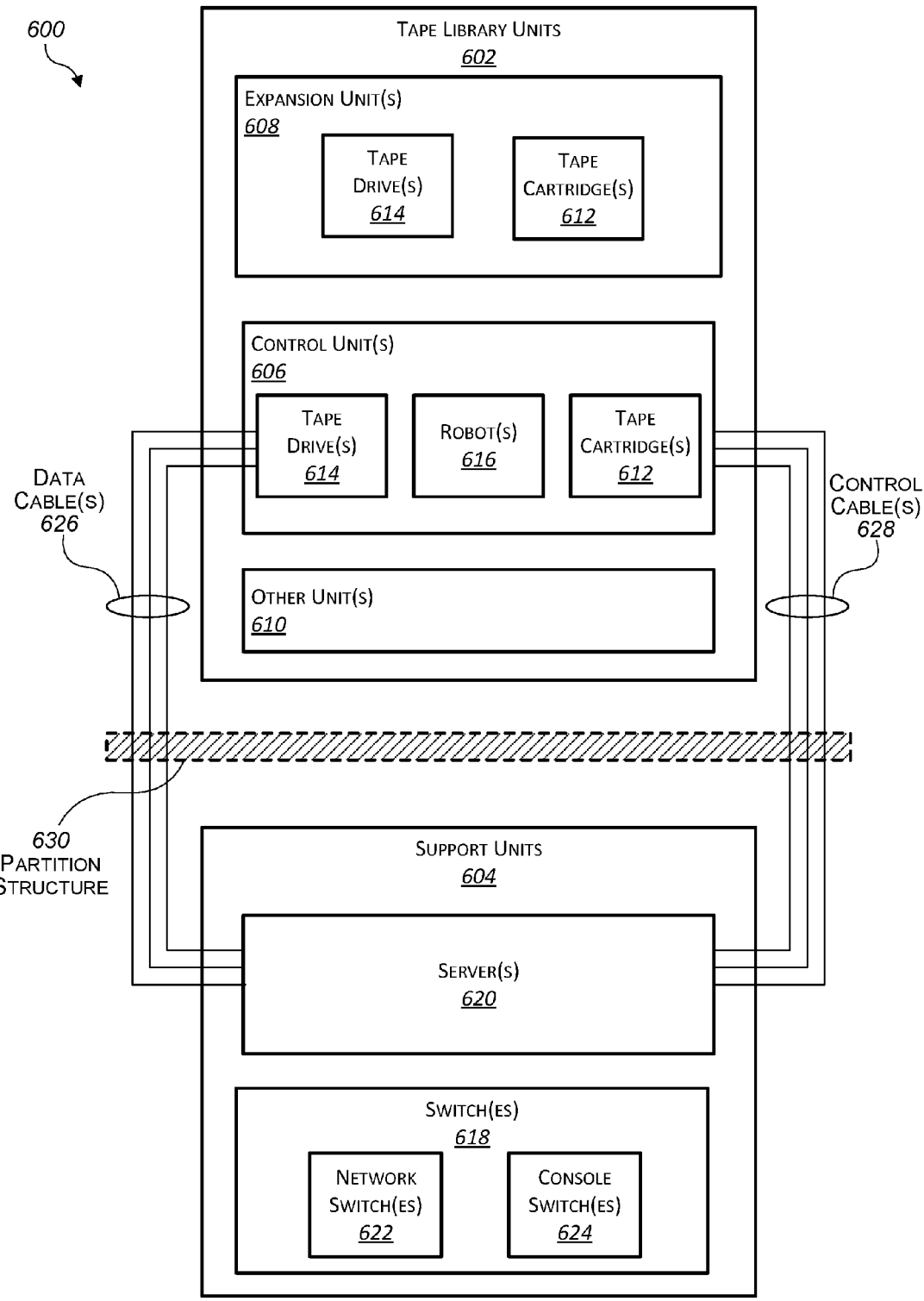
FIG. 6 illustrates a schematic block diagram of example components within an interior of a tape library rack module, in accordance with some embodiments.

FIG. 6 illustrates a schematic block diagram of example components 600 within an interior of a tape library rack module (e.g., according to one or more embodiments of the tape library rack modules described above and below with reference to FIGS. 1-5 and 7-10), in accordance with some embodiments. The components 600 may include one or multiple tape library units 602 and/or one or multiple support units 604.

In some embodiments, the tape library units 602 may include one or multiple control units 606, one or multiple expansion units 608, and/or one or multiple other units 610. Individual ones of the tape library units 602 may include, or provide storage locations for, tape cartridges 612 that are configured to store/archive data. For instance, the tape cartridges 612 may allow for long-term data storage. Furthermore, individual ones of the control units 606 and/or individual ones of the expansion units 608 may include one or multiple tape drives 614 that are configured to read data from and/or write data to the tape cartridges 612.

In some examples, a control unit 606 may include a robot 616 configured to transport tape cartridges 612 to and from tape drives 614. The robot 616 may be configured to traverse the some or all of the tape library units 602. For example, the robot 616 may traverse the expansion units 608 to retrieve a tape cartridge 612 from a storage location within an expansion unit 608. The robot 616 may transport the tape cartridge 612 to a tape drive 614 in the control unit 606 or in another expansion unit 608. The tape drive 614 may read data from and/or write data to the tape cartridge 612. The robot 616 may then transport the tape cartridge 612 from the tape drive 614 back to the tape cartridge's storage location within the expansion unit 608.

In some embodiments, the support units 604 may include one or multiple switches 618 and/or one or multiple servers 620. For instance, the switches 618 may include a network switch 6622 configured to provide network connectivity between the servers 620 and a network that is exterior to the tape library rack module, e.g., a data center network. Additionally, or alternatively, the switches 618 may include a console switch 624 configured to allow console access to the servers 620, e.g., for administrative purposes.

In some cases, the servers 620 may communicate with the control units 606 and/or the tape drives 614. For instance, a server 620 may receive data (e.g., data to be written to a tape cartridge 612) and/or control information (e.g., information associated with controlling the robot 616) via a data center network. The server 620 may send the data to a tape drive 614 via one or more data cables 626 (e.g., serial attached SCSI (SAS) cable(s), Fibre Channel cable(s), etc.). The data cables 626 may couple the server 620 with the tape drive 614. Furthermore, in some examples, control information may be transmitted from the server 620 to a control unit 606 via one or more control cables 628 (e.g., Ethernet cable(s)). The control cables 628 may couple the server 620 with the control unit 606. The control unit 606 may control the robot 616 based at least in part on the control information received from the server 620.

In some embodiments, the components 600 within the interior of the tape library rack module may include a partition structure 630, such as the partition structures described above with reference to FIGS. 4 and 5. In some examples, the partition structure 630 may include passages configured to allow the cables 626, 628 to pass through while maintaining environmental isolation for the interior portion in which the tape library units are located.

The components 600 within the interior of the tape library rack module may include components other than those shown in FIG. 6. For instance, the components 600 may include one or multiple power distribution units configured to receive power and distribute the power to the tape library units 602 and/or the support units 604.

Figure 7:
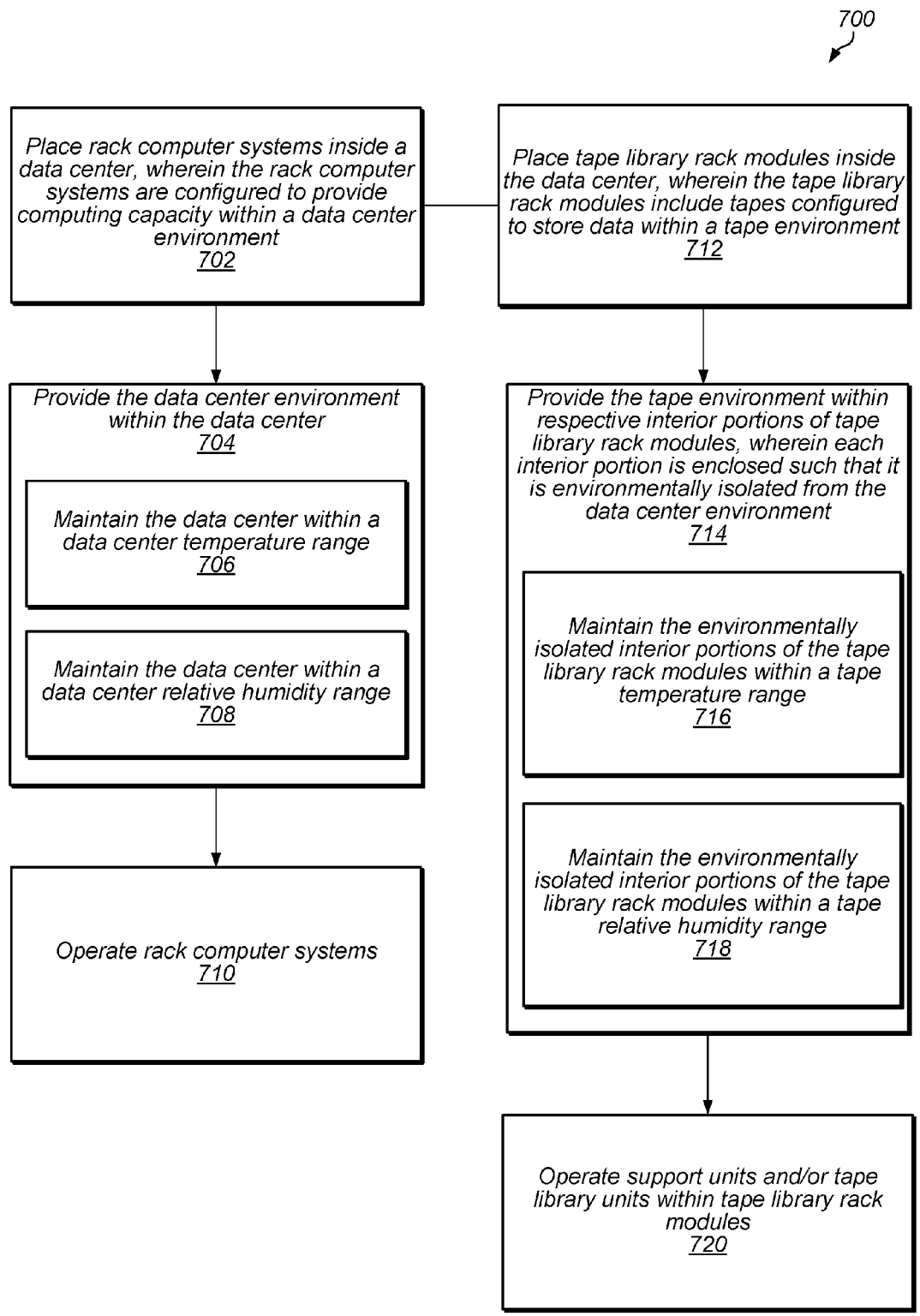
FIG. 7 is a flowchart of an example method of deploying and operating tape library rack modules along with rack computer systems within a data center, in accordance with some embodiments.

FIG. 7 is a flowchart of an example method 700 of deploying and operating tape library rack modules (e.g., according to one or more embodiments of the tape library rack modules described above and below with reference to FIGS. 1-6 and 8-10) along with rack computer systems within a data center, in accordance with some embodiments.

At 702, the method 700 may include placing rack computer systems inside a data center. The rack computer systems may be configured to provide computing capacity within a data center environment inside the data center. At 704, the method 700 may include providing the data center environment within the data center. In some cases, one or multiple climate control systems may be used to provide the data center environment. For instance, a cooling system may be used to cool the data center, a heating system may be used to heat the data center, a humidifying system may be used to add moisture to the data center, etc.

At 706, providing the data center environment may include maintaining the data center within a data center temperature range. In some examples, the data center temperature range may be from about 5 degrees Celsius to about 40 degrees Celsius. However, the data center temperature range may be different in other embodiments.

At 708, providing the data center environment may include maintaining the data center within a data center relative humidity range. In some examples, the data center relative humidity range may be from about 8 percent to about 85 percent. However, the data center relative humidity range may be different in other embodiments.

At 710, the method 700 may include operating the rack computer systems. For instance, the rack computer systems may be used to communicate with the servers in the tape library rack modules, to process requests for accessing data from tape cartridges in the tape library rack modules, and/or to provide other computer functions.

At 712, the method 700 may include placing tape library rack modules inside the data center. The tape library rack modules may include tape cartridges configured to store data within a tape environment. In some examples, tape library rack modules may be placed in a same rack row as rack computer systems. Additionally, or alternatively, tape library rack modules may be placed in different rows than the rack computer systems. For instance, tape library rack modules may be placed in rows that are exclusive to tape library rack modules, and rack computer systems may be placed in rows that are specific to rack computer systems. In some embodiments, tape library rack modules may not be placed in rows. For example, the tape library rack modules may be placed within the data center as standalone modules.

At 714, the method 700 may include providing the tape environment within respective interior portions of the tape library rack modules. Each of the interior portions may be enclosed such that it is environmentally isolated from the data center environment. In some examples, the interior portions are completely sealed such that the tape environment is contained within the interior portions. The tape environment may be different than the data center environment. In some cases, the tape environment may include tighter ranges of environmental parameters than those of the data center environment. For instance, a tape temperature range of the tape environment may be narrower than a data center temperature range of the data center environment. As another example, a tape relative humidity range may be narrower than a data center relative humidity range of the data center environment.

At 716, providing the tape environment may include maintaining the environmentally isolated interior portions of the tape library rack modules within a tape temperature range. In some examples, the tape temperature range may be from about 16 degrees Celsius to about 25 degrees Celsius. However, the tape temperature range may be different in other embodiments.

At 718, providing the tape environment may include maintaining the environmentally isolated interior portions of the tape library rack modules within a tape relative humidity. In some examples, the tape relative humidity range may be from about 20 percent to about 50 percent. However, the tape relative humidity range may be different in other embodiments.

In some embodiments, the environmentally isolated interior portions of the tape library rack modules may be maintained within the tape environment based at least in part on a cooling unit and/or a humidifier unit, e.g., as described in further detail above and below with reference to FIGS. 1-5, 8, and 9.

At 720, the method 700 may include operating the support units and/or tape library units within the tape library rack modules. For instance, as described above with reference to FIG. 6, a server in a support unit may receive a request to read data from or write data to a tape cartridge in the tape library units. The server may communicate with a control module in the tape library units. The control module may control a robot to transport the tape cartridge to a tape drive, and the tape drive may perform the requested read/write operations on the tape cartridge.

Figure 8:
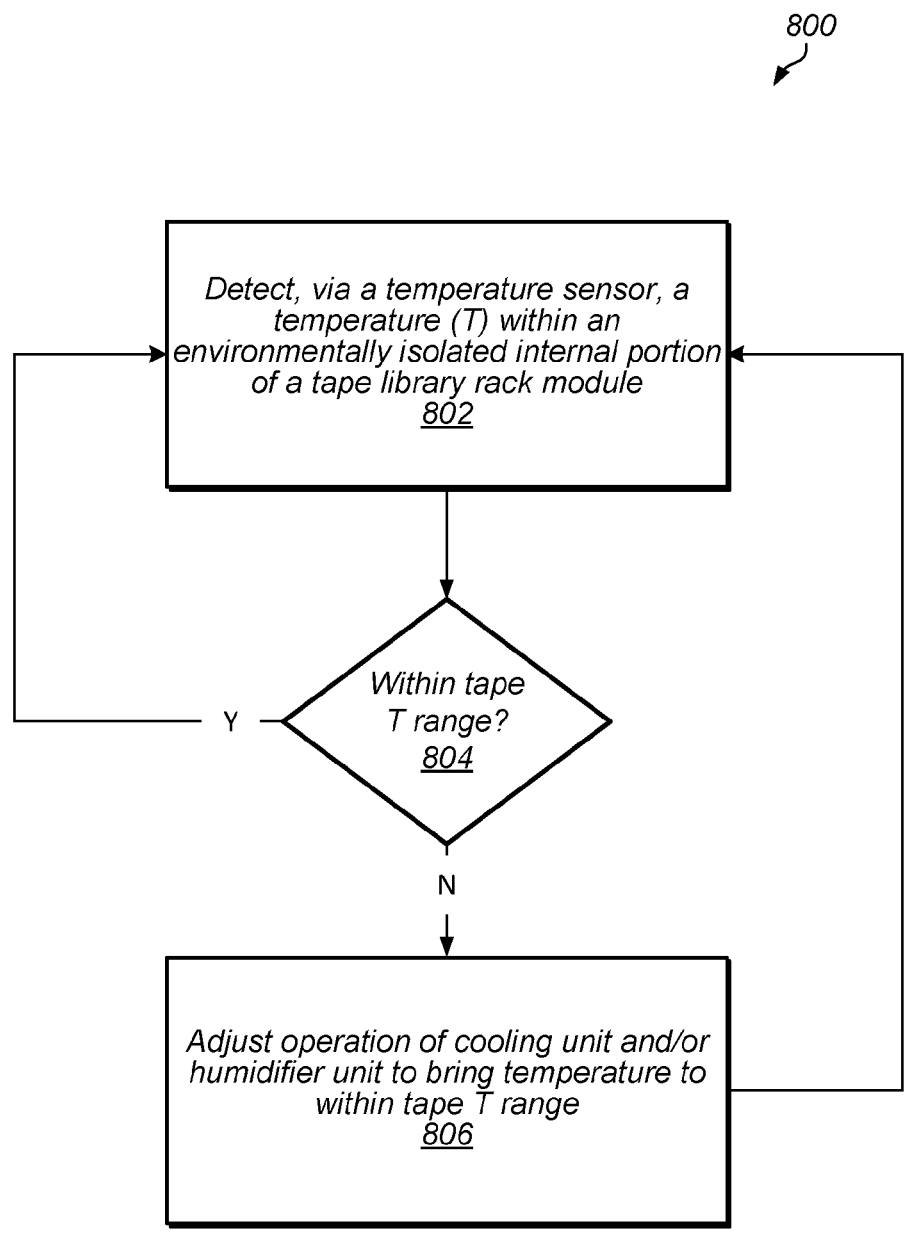
FIG. 8 is a flowchart of an example method of controlling a tape environment within an environmentally isolated interior of a tape library rack module, in accordance with some embodiments.

FIG. 8 is a flowchart of an example method 800 of controlling a tape environment within an environmentally isolated interior portion of a tape library rack module (e.g., according to one or more embodiments of the tape library rack modules described above and below with reference to FIGS. 1-7, 9, and 10), in accordance with some embodiments.

At 802, the method 800 may include detecting a temperature within the environmentally isolated interior portion of the tape library rack module. For instance, as described above with reference to FIG. 2, one or more temperature sensors may be used to detect the temperature. The sensors may be disposed within the interior portion of the tape library rack module.

At 804, the method 800 may include determining whether the detected temperature is within a tape temperature range of a tape environment. If, at 804, it is determined that the detected temperature is not within the tape temperature range of the tape environment, then the method 800 may include adjusting the operation of a cooling unit and/or a humidifier unit of the tape library rack module to bring the temperature to within the tape temperature range, at 806. The method 800 may further include continuing to detect the temperature within the environmentally isolated internal portion of the tape library rack module, at 802, and determining whether the detected temperature is within the tape temperature range, at 804.

If, at 804, it is determined that the detected temperature is within the tape temperature range of the tape environment, then the method 800 may include continuing to detect the temperature within the environmentally isolated interior portion of the tape library rack module, at 802, and determining whether the detected temperature is within the tape temperature range, at 804.

Figure 9:
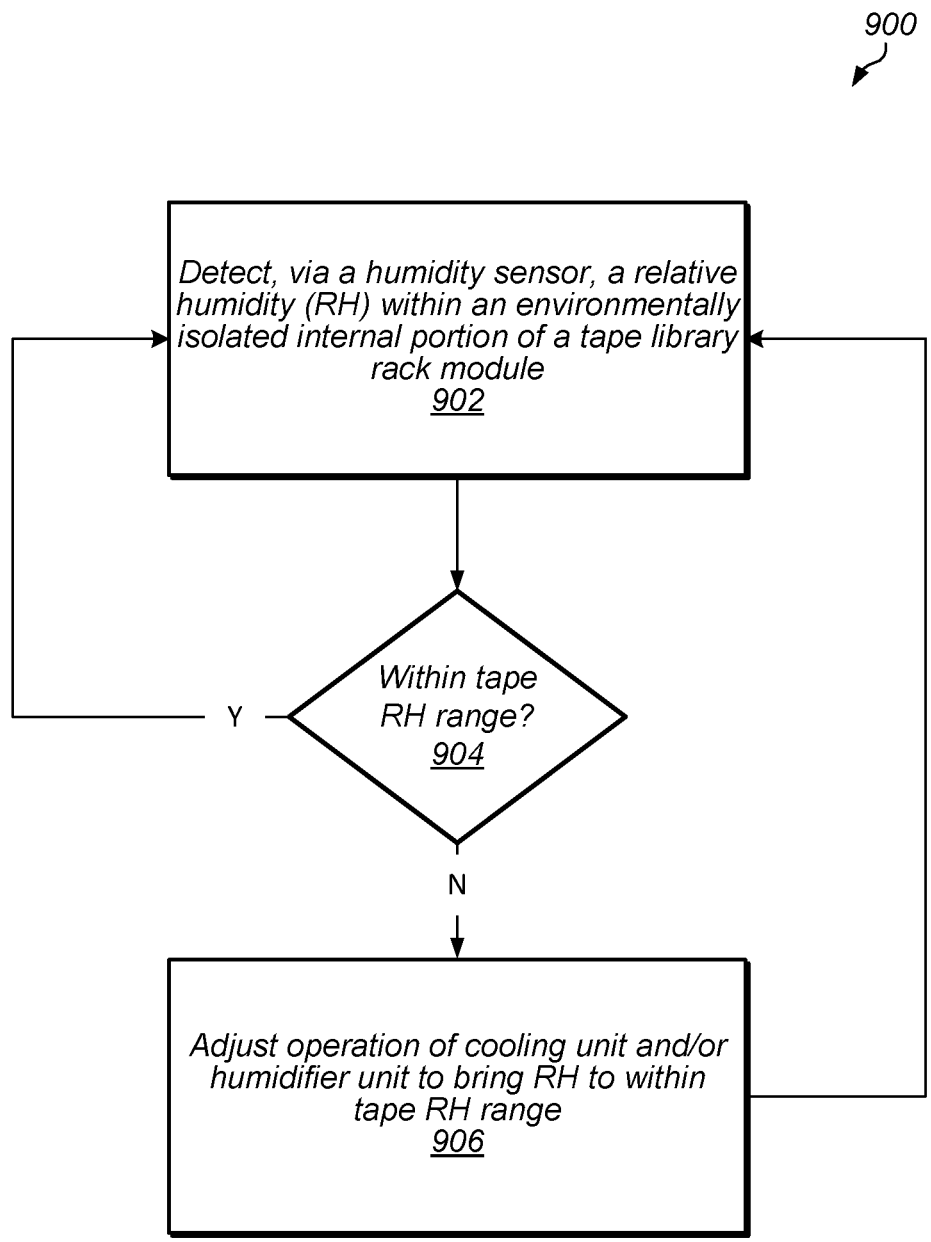
FIG. 9 is a flowchart of another example method of controlling a tape environment within an environmentally isolated interior of a tape library rack module, in accordance with some embodiments.

FIG. 9 is a flowchart of another example method 900 of controlling a tape environment within an environmentally isolated interior portion of a tape library rack module (e.g., according to one or more embodiments of the tape library rack modules described above and below with reference to FIGS. 1-8 and 10), in accordance with some embodiments.

At 902, the method 900 may include detecting a relative humidity within the environmentally isolated interior portion of the tape library rack module. For instance, as described above with reference to FIG. 2, one or more humidity sensors may be used to detect the relative humidity. The sensors may be disposed within the interior portion of the tape library rack module.

At 904, the method 900 may include determining whether the detected relative humidity is within a tape relative humidity range of a tape environment. If, at 904, it is determined that the detected relative humidity is not within the tape relative humidity range of the tape environment, then the method 900 may include adjusting the operation of a cooling unit and/or a humidifier unit of the tape library rack module to bring the relative humidity to within the tape relative humidity range, at 906. The method 900 may further include continuing to detect the relative humidity within the environmentally isolated internal portion of the tape library rack module, at 902, and determining whether the detected relative humidity is within the tape relative humidity range, at 904.

If, at 904, it is determined that the detected relative humidity is within the tape relative humidity range of the tape environment, then the method 900 may include continuing to detect the relative humidity within the environmentally isolated interior portion of the tape library rack module, at 902, and determining whether the detected relative humidity is within the tape relative humidity range, at 904.

Figure 10:
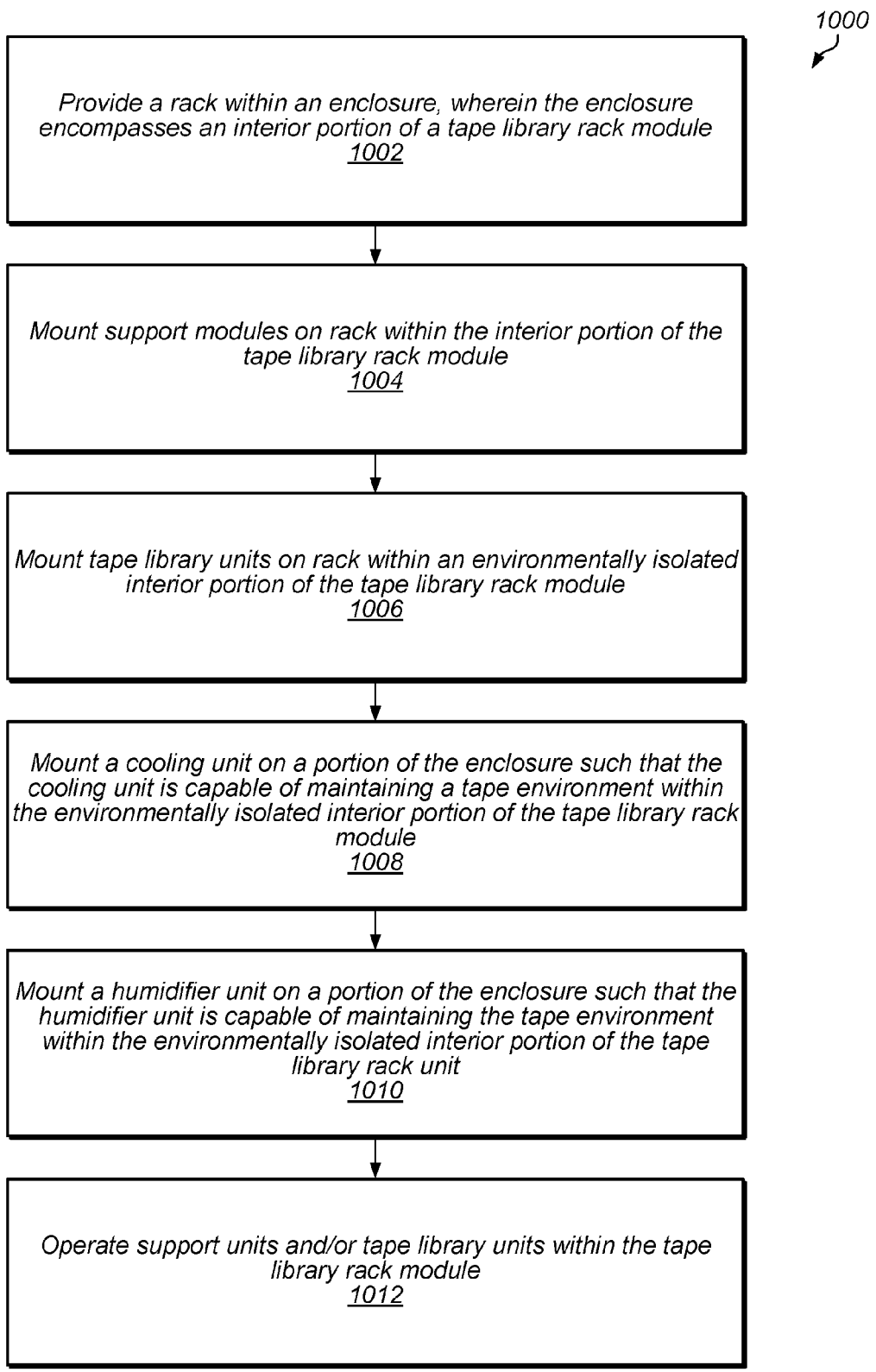
FIG. 10 is a flowchart of an example method of constructing a tape library rack module and operating modules within the tape library rack module, in accordance with some embodiments.

FIG. 10 is a flowchart of an example method 1000 of constructing a tape library rack module (e.g., according one or more embodiments of the tape library rack modules described above with reference to FIGS. 1-9) and operating modules within the tape library rack module, in accordance with some embodiments.

At 1002, the method 1000 may include providing a rack within an enclosure. The enclosure may encompass an interior of the tape library rack module. In some embodiments, the rack may be a standard rack that is 42 U high. However, the rack size may be different in other embodiments.

At 1004, the method 1000 may include mounting one or multiple support units on a rack within the interior portion of the tape library rack module. For instance, as described above with reference to FIG. 6, the support units may include one or multiple switches and/or one or multiple servers. In some embodiments, each of the support units may be 1 U in height. However, the size(s) of the support units may vary in other embodiments.

At 1006, the method 1000 may include mounting one or multiple tape library units on the rack within an environmentally isolated interior portion of the tape library rack module. For instance, as described above with reference to FIG. 6, the tape library rack units may include one or multiple control modules and/or one or multiple expansion modules. In some examples, the tape library units may include units that range from 1 U in height to 6 U in height. However, the size(s) of the tape library units may vary in other embodiments.

At 1008, the method 1000 may include mounting a cooling unit on a portion of the enclosure such that the cooling unit is capable of maintaining a tape environment within the environmentally isolated interior portion of the tape library rack module. For instance, as described above with reference to FIGS. 1, 2, and 4, the cooling unit may be mounted on a top wall of the enclosure. In other implementations, e.g., as described above with reference to FIGS. 3 and 5, the cooling unit may be mounted on a bottom wall of the enclosure. By mounting the cooling unit on the top wall or the bottom wall of the enclosure, the tape library rack module may be placed in a rack row without the cooling unit interfering with adjacent placement of another tape library rack module or rack computer system. However, in other embodiments, the cooling unit may be mounted on another portion of the enclosure, such as a front wall, rear wall, or side wall of the enclosure.

At 1010, the method 1000 may include mounting a humidifier unit on a portion of the enclosure such that the humidifier unit is capable of maintaining the tape environment within the environmentally isolated interior portion of the tape library rack module. For instance, as described above with reference to FIGS. 1-5, the humidifier unit may be mounted on a rear wall of the enclosure. However, in other embodiments, the humidifier unit may be mounted on another portion of the enclosure, such as a top wall, a bottom wall, a front wall, or a side wall of the enclosure.

At 1012, the method 1000 may include operating the support units and/or the tape library units within the tape library rack module. For instance, as described above with reference to FIG. 6, a server in a support unit may receive a request to read data from or write data to a tape cartridge in the tape library units. The server may communicate with a control module in the tape library units. The control module may control a robot to transport the tape cartridge to a tape drive, and the tape drive may perform the requested read/write operations on the tape cartridge.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
   a rack computer system configured to provide computing capacity within a first environment inside the data center, wherein the first environment is maintained to within a first temperature range and a first relative humidity range; and
   a tape library rack module, including:
      an enclosure encompassing an interior of the tape library rack module;
      a rack within the interior of the tape library rack module;
      a tape library unit mounted on the rack within a portion of the interior of the tape library rack module, wherein:
         the portion of the interior is enclosed such that it is environmentally isolated from the first environment inside the data center; and
         the tape library unit includes tape cartridges configured to store data within a second environment that includes:
            a second temperature range that is different than the first temperature range of the first environment inside the data center; and
            a second relative humidity range that is different than the first relative humidity range of the first environment inside the data center;
      a cooling unit configured to cool the portion of the interior;
      a humidifier unit configured to humidify the portion of the interior;
      wherein the tape library rack module is configured to maintain the second environment within the portion of the interior based at least in part on the cooling unit and the humidifier unit.

2. The data center of claim 1, wherein:
   the portion of the interior of the tape library rack module is a first portion of the interior; and
   the tape library rack module further includes:
      a server mounted on the rack within a second portion of the interior; and
      a partition structure that partitions the first portion of the interior from the second portion of the interior such that the first portion of the interior is environmentally isolated from the second portion of the interior.

3. The data center of claim 1, wherein:
   the enclosure includes:
      a top wall;
      a bottom wall opposite the top wall;
      a front wall that includes a door configured to provide access to the interior of the tape library rack module;
      a rear wall opposite the front wall;
      a first side wall; and
      a second side wall opposite the first side wall;
   the cooling unit is mounted on the top wall of the enclosure; and
   the humidifier unit is mounted on the rear wall of the enclosure.

4. The data center of claim 1, wherein:
   the enclosure of the tape library rack module is a first enclosure;
   the rack computer system is at least partially enclosed by a second enclosure; and
   the first enclosure and the second enclosure are in a same rack row of the data center.

5. The data center of claim 1, wherein:
   the first temperature range of the first environment is from about 5 degrees Celsius to about 40 degrees Celsius;
   the second temperature range of the second environment is from about 16 degrees Celsius to about 25 degrees Celsius;
   the first relative humidity range of the first environment is from about 8 percent to about 85 percent; and
   the second relative humidity range of the second environment is from about 20 percent to about 50 percent.

6. An apparatus, comprising:
   an enclosure configured to encompass an interior of the apparatus;
   a rack within the interior, the rack configured to have a tape library unit mounted thereon within a portion of the interior, wherein:
      the tape library unit includes tape cartridges configured to store data within a first environment that is maintained to within at least one of a first temperature range or a first relative humidity range; and
   at least one of:
      a cooling unit configured to cool the portion of the interior; or
      a humidifier unit configured to humidify the portion of the interior;

wherein:
the apparatus is configured to maintain the first environment within the portion of the interior using the cooling unit or the humidifier unit; and
the portion of the interior is enclosed such that it is environmentally isolated from a second environment that is external to the enclosure and that is maintained to within at least one of a second temperature range or a second relative humidity range.

7. The apparatus of claim 6, wherein:
the portion of the interior is a first portion of the interior; and
the apparatus further includes:
a server mounted on the rack within a second portion of the interior; and
a partition structure that partitions the first portion of the interior from the second portion of the interior such that the first portion of the interior is environmentally isolated from an environment of the second portion of the interior.

8. The apparatus of claim 6, wherein:
the tape library unit is a first tape library unit that includes a tape drive;
the apparatus further includes:
a second tape library unit that includes a tape cartridge of the tape cartridges;
each of the first tape library unit or the second tape library unit is a tape library control unit that includes a robot configured to:
transport the tape cartridge from a storage location of the tape cartridge in the second tape library unit to the tape drive in the first tape library unit; and
transport the tape cartridge from the tape drive in the first tape library unit to the storage location of the tape cartridge in the second tape library unit.

9. The apparatus of claim 6, wherein:
the apparatus includes the cooling unit and the humidifier unit;
the enclosure includes:
a top wall;
a bottom wall opposite the top wall;
a front wall that includes a door configured to provide access to the interior of the apparatus;
a rear wall opposite the front wall;
a first side wall; and
a second side wall opposite the first side wall;
the cooling unit is mounted on the top wall of the enclosure; and
the humidifier unit is mounted on the rear wall of the enclosure.

10. The apparatus of claim 6, wherein:
the apparatus includes the humidifier unit; and
the apparatus further includes:
a drain tank configured to capture condensate for use as a water supply to the humidifier unit.

11. The apparatus of claim 6, wherein:
the first environment includes the first temperature range;
the second environment includes the second temperature range; and
the first temperature range is narrower than the second temperature range.

12. The apparatus of claim 11, wherein:
the first temperature range of the first environment is from about 16 degrees Celsius to about 25 degrees Celsius; and
the second temperature range of the second environment is from about 5 degrees Celsius to about 40 degrees Celsius.

13. The apparatus of claim 6, wherein:
the first environment includes the first relative humidity range;
the second environment includes the second relative humidity range; and
the first relative humidity range is narrower than the second relative humidity range.

14. The apparatus of claim 13, wherein:
the first relative humidity range of the first environment is from about 20 percent to about 50 percent; and
the second relative humidity range of the second environment is from about 8 percent to about 85 percent.

15. A method, comprising:
providing a first environment to an interior portion of a tape library rack module, wherein:
the tape library rack module includes:
an enclosure that encompasses an interior of the tape library rack module, wherein the interior includes the interior portion;
a rack within the interior of the tape library rack module;
a tape library unit mounted on the rack within the interior portion, wherein the tape library unit includes tape cartridges configured to store data within the first environment;
a cooling unit; and
a humidifier unit;
the interior portion is enclosed such that the interior portion is environmentally isolated from a second environment that is external to the tape library rack module and that is maintained to within at least one of a second temperature range or a second relative humidity range; and
the providing the first environment includes maintaining a first temperature range of the first environment and a first relative humidity range of the first environment based at least in part on at least one of:
cooling, via the cooling unit, the interior portion; or
humidifying, via the humidifier unit, the interior portion.

16. The method of claim 15, wherein the maintaining the first temperature range and the first relative humidity range further includes:
providing heat to the interior portion via at least one of:
heat produced by one or more electronic components within a second interior portion, wherein:
the interior portion is a first interior portion that is partitioned from the second interior portion; and
the first environment is provided to the interior portion but not the another interior portion; or
heat produced by a heating unit that is coupled to the enclosure.

17. The method of claim 15, further comprising:
providing the second environment inside a data center in which the tape library rack module is located, wherein the providing the second environment includes:
maintaining a temperature inside the data center within a second temperature range of the second environment, wherein the second temperature range is greater than the first temperature range of the first environment; and
maintaining a relative humidity inside the data center within a second relative humidity range of the second environment, wherein the second relative humidity range is greater than the first relative humidity range of the first environment;

wherein the data center includes rack computer systems configured to provide computing capacity within the second environment.

18. The method of claim 17, wherein:

the first temperature range of the first environment is from about 16 degrees Celsius to about 25 degrees Celsius;

the second temperature range of the second environment is from about 5 degrees Celsius to about 40 degrees Celsius;

the first relative humidity range of the first environment is from about 20 percent to about 50 percent; and the second relative humidity range of the second environment is from about 8 percent to about 85 percent.

19. The method of claim 15, wherein:

the interior portion of the tape library rack module is a first interior portion;

the interior of the tape library rack module further includes a second interior portion that is partitioned from the first interior portion; and the providing the first environment to the interior portion includes:

providing the first environment to the first interior portion but not the second interior portion.

20. The method of claim 15, further comprising:

while providing the first environment to the interior portion of the tape library rack module:

sending, via a cable, data from a server within the interior of the tape library rack module to a tape drive within the tape library unit, wherein the cable couples the server to the tape drive; and writing, via the tape drive, the data to a tape cartridge of the tape cartridges.

* * * * *